(12) United States Patent
Lin et al.

(10) Patent No.: US 12,278,287 B2
(45) Date of Patent: Apr. 15, 2025

(54) SELECTIVE INTERNAL GATE STRUCTURE FOR FERROELECTRIC SEMICONDUCTOR DEVICES

(71) Applicant: Taiwan Semiconductor Manufacturing Co., Ltd., Hsinchu (TW)

(72) Inventors: Cheng-Ming Lin, Kaohsiung (TW); Sai-Hooi Yeong, Zhubei (TW); Ziwei Fang, Hsinchu (TW); Chi On Chui, Hsinchu (TW); Huang-Lin Chao, Hillsboro, OR (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/175,346

(22) Filed: Feb. 27, 2023

(65) Prior Publication Data

US 2023/0207695 A1 Jun. 29, 2023

Related U.S. Application Data

(63) Continuation of application No. 17/328,145, filed on May 24, 2021, now Pat. No. 11,594,633, which is a
(Continued)

(51) Int. Cl.
*H01L 29/78* (2006.01)
*H01L 21/02* (2006.01)
(Continued)

(52) U.S. Cl.
CPC .. *H01L 29/78391* (2014.09); *H01L 21/02068* (2013.01); *H01L 29/40111* (2019.08);
(Continued)

(58) Field of Classification Search
CPC ........... H01L 29/7856; H01L 29/42364; H01L 29/42376; H01L 29/66795; H01L 29/785;
(Continued)

(56) References Cited

U.S. PATENT DOCUMENTS 6,437,387 B2 * 8/2002 Gutsche ............... H10B 12/033
257/E21.648
8,154,850 B2 * 4/2012 Zelner .................. H01G 4/1245
361/321.1
(Continued)

OTHER PUBLICATIONS

Office Action issued in Taiwanese Patent Application No. 109123173 dated Dec. 31, 2020, 5 pages.

*Primary Examiner* — Sophia T Nguyen
(74) *Attorney, Agent, or Firm* — Sterne, Kessler, Goldstein & Fox P.L.L.C.

(57) ABSTRACT

The present disclosure relates to a semiconductor device including a substrate and first and second spacers on the substrate. The semiconductor device also includes a gate stack between the first and second spacers. The gate stack includes a gate dielectric layer having a first portion formed on the substrate and a second portion formed on the first and second spacers; an internal gate formed on the first and second portions of the gate dielectric layer; a ferroelectric dielectric layer formed on the internal gate and in contact with the gate dielectric layer; and a gate electrode on the ferroelectric dielectric layer.

20 Claims, 7 Drawing Sheets

Related U.S. Application Data continuation of application No. 16/549,245, filed on Aug. 23, 2019, now Pat. No. 11,018,256.

(51) Int. Cl.
 *H01L 21/28* (2006.01)
 *H01L 29/51* (2006.01)
 *H01L 29/66* (2006.01)

(52) U.S. Cl.
 CPC ...... *H01L 29/516* (2013.01); *H01L 29/66795* (2013.01); *H01L 29/6684* (2013.01); *H01L 29/7851* (2013.01)

(58) Field of Classification Search
 CPC ........... H01L 29/7851; H01L 29/40111; H01L 29/78391; H01L 29/66545; H01L 29/516; H01L 29/6684; H01L 21/28114; H01L 21/283821; H01L 21/82345; H01L 21/823842; H01L 21/823857; H01L 21/823462; H01L 21/823456; H01L 21/823431; H01L 29/4966; H01L 29/4958; H01L 21/28088; H01L 21/82385; H10B 51/00; H10B 51/30; H10B 53/00; H10B 53/30
 See application file for complete search history.

(56) References Cited

U.S. PATENT DOCUMENTS

| | | | | |
|---|---|---|---|---|
| 8,951,855 B2* | 2/2015 | Lai | ................ | H01L 21/823842 438/199 |
| 9,196,696 B2* | 11/2015 | Xie | ................ | H01L 21/32135 |
| 9,287,263 B1* | 3/2016 | Hsu | ................ | H01L 21/28088 |
| 9,613,959 B2* | 4/2017 | Wang | ............... | H01L 29/66545 |
| 10,043,803 B2* | 8/2018 | Chung | ............ | H01L 21/823842 |
| 10,050,143 B2* | 8/2018 | Ando | ................ | H01L 21/28088 |
| 10,128,236 B2* | 11/2018 | Jeong | ................ | H01L 29/4966 |
| 10,141,414 B1* | 11/2018 | Galatage | ............... | H01L 29/788 |
| 10,164,059 B2* | 12/2018 | Peng | ................ | H01L 29/66795 |
| 10,985,275 B2* | 4/2021 | Kim | ................ | B82Y 10/00 |
| 11,018,256 B2* | 5/2021 | Lin | ................ | H01L 29/40111 |
| 11,594,633 B2* | 2/2023 | Lin | ................ | H01L 29/6684 |
| 11,888,063 B2* | 1/2024 | Kim | ................ | B82Y 10/00 |
| 2003/0107068 A1* | 6/2003 | Forbes | ............... | H01L 29/40111 257/295 |
| 2005/0001323 A1 | 1/2005 | Watanabe | | |
| 2005/0051829 A1* | 3/2005 | Goto | ................ | H01L 28/65 257/E21.012 |
| 2008/0237869 A1* | 10/2008 | Li | ................ | H01L 21/76877 257/E23.145 |
| 2008/0265322 A1* | 10/2008 | Lin | ................ | H01L 29/66606 257/E29.345 |
| 2010/0044783 A1* | 2/2010 | Chuang | ............ | H01L 21/28114 438/589 |
| 2011/0210326 A1* | 9/2011 | Suzawa | ............ | H01L 29/41733 257/288 |
| 2011/0263115 A1* | 10/2011 | Ganguli | ............ | H01L 21/28562 257/E21.19 |
| 2012/0088359 A1* | 4/2012 | Kim | ................ | H01L 29/66545 257/E21.409 |
| 2012/0292677 A1* | 11/2012 | Dubourdieu | ...... | H01L 29/42316 257/295 |
| 2013/0034938 A1* | 2/2013 | Cheng | ............ | H01L 29/66545 257/E21.415 |
| 2013/0049109 A1* | 2/2013 | Lim | ................ | H01L 21/285 257/334 |
| 2013/0082308 A1* | 4/2013 | Cheng | ................ | H01L 29/4983 257/E21.409 |
| 2013/0299918 A1* | 11/2013 | Kim | ................ | H01L 29/7856 257/402 |
| 2014/0008720 A1* | 1/2014 | Xie | ................ | H01L 27/0922 438/587 |
| 2014/0077274 A1* | 3/2014 | Xie | ................ | H01L 29/66545 438/514 |
| 2014/0231885 A1* | 8/2014 | Xie | ................ | H01L 29/6656 438/585 |
| 2015/0024584 A1* | 1/2015 | Wells | ................ | H01L 29/66795 438/589 |
| 2015/0041905 A1* | 2/2015 | Xie | ................ | H01L 29/517 257/369 |
| 2015/0206963 A1* | 7/2015 | Ho | ................ | H01L 21/32134 257/411 |
| 2015/0243564 A1* | 8/2015 | Zhao | ................ | H01L 21/823857 438/591 |
| 2015/0349073 A1* | 12/2015 | Kang | ................ | H01L 29/66621 257/330 |
| 2016/0042954 A1* | 2/2016 | Sung | ................ | H01L 29/4966 438/587 |
| 2016/0049488 A1* | 2/2016 | Shen | ................ | H01L 29/42376 257/368 |
| 2016/0071947 A1 | 3/2016 | Wiatr et al. | | |
| 2016/0104704 A1* | 4/2016 | Fang | ................ | H01L 29/4238 438/275 |
| 2016/0172488 A1* | 6/2016 | Oh | ................ | H10B 63/30 257/330 |
| 2016/0181384 A1* | 6/2016 | Liu | ................ | H01L 29/66772 438/270 |
| 2016/0240624 A1* | 8/2016 | Zhu | ................ | H01L 29/66568 |
| 2016/0284699 A1* | 9/2016 | Jeong | ................ | H01L 29/42376 |
| 2016/0293493 A1* | 10/2016 | Fan | ................ | H01L 27/0924 |
| 2016/0336312 A1* | 11/2016 | Yan | ................ | H01L 29/40111 |
| 2016/0372382 A1* | 12/2016 | Lee | ................ | H01L 21/823842 |
| 2017/0012107 A1* | 1/2017 | Park | ................ | H01L 21/28088 |
| 2017/0033105 A1* | 2/2017 | Wang | ................ | H01L 29/7851 |
| 2017/0154972 A1* | 6/2017 | Hsieh | ................ | H01L 29/6659 |
| 2017/0154999 A1* | 6/2017 | Ramaswamy | ........ | H01L 29/516 |
| 2017/0186746 A1* | 6/2017 | Chung | ................ | H01L 29/0649 |
| 2017/0243869 A1* | 8/2017 | Chang | ................ | H01L 29/517 |
| 2017/0365719 A1* | 12/2017 | Chen | ................ | H01L 29/40111 |
| 2018/0006129 A1* | 1/2018 | Xing | ................ | H01L 29/516 |
| 2018/0026039 A1* | 1/2018 | Chang | ............ | H01L 21/823821 257/369 |
| 2018/0076334 A1* | 3/2018 | Ando | ................ | H01L 29/1083 |
| 2018/0145150 A1* | 5/2018 | Ando | ................ | H01L 21/3212 |
| 2018/0151745 A1* | 5/2018 | Chang | ................ | H01L 27/0886 |
| 2018/0175165 A1* | 6/2018 | Lim | ................ | H01L 29/42376 |
| 2018/0197786 A1* | 7/2018 | Li | ................ | H01L 21/02164 |
| 2018/0323309 A1* | 11/2018 | Ando | ................ | H10B 53/30 |
| 2018/0342599 A1* | 11/2018 | Chang | ................ | H01L 29/785 |
| 2019/0058049 A1 | 2/2019 | Then | | |
| 2019/0067488 A1* | 2/2019 | Tsai | ................ | H01L 29/66545 |
| 2019/0115437 A1* | 4/2019 | Galatage | ............ | H01L 29/40114 |
| 2019/0130956 A1* | 5/2019 | Müller | ................ | H01L 29/0673 |
| 2019/0130957 A1* | 5/2019 | Müller | ................ | H10B 51/30 |
| 2019/0131382 A1* | 5/2019 | Lu | ................ | H01L 29/78391 |
| 2019/0131425 A1* | 5/2019 | Lu | ................ | H01L 29/66545 |
| 2019/0140068 A1* | 5/2019 | Tsai | ................ | H01L 21/02194 |
| 2019/0157410 A1* | 5/2019 | Yim | ................ | H01L 27/0922 |
| 2019/0198617 A1* | 6/2019 | Li | ................ | H01L 29/66659 |
| 2019/0267446 A1* | 8/2019 | Hou | ................ | H01L 29/78391 |
| 2020/0098622 A1* | 3/2020 | Su | ................ | H01L 21/823814 |
| 2020/0395455 A1* | 12/2020 | Kim | ................ | H10B 12/488 |
| 2020/0395461 A1 | 12/2020 | Kim | | |
| 2021/0020786 A1* | 1/2021 | Lin | ................ | H01L 29/78391 |
| 2021/0057581 A1* | 2/2021 | Lin | ................ | H01L 29/78 |
| 2021/0265507 A1* | 8/2021 | Peng | ................ | H01L 21/02356 |
| 2021/0328064 A1* | 10/2021 | Lin | ................ | H01L 29/66795 |
| 2021/0328065 A1* | 10/2021 | Lin | ................ | H01L 21/02181 |
| 2023/0138121 A1* | 5/2023 | Park | ................ | H01L 29/0673 257/351 |
| 2023/0207695 A1* | 6/2023 | Lin | ................ | H01L 29/6684 257/295 |

\* cited by examiner

SELECTIVE INTERNAL GATE STRUCTURE FOR FERROELECTRIC SEMICONDUCTOR DEVICES

CROSS-REFERENCE TO RELATED APPLICATIONS

This application is a continuation of U.S. Non-provisional patent application Ser. No. 17/328,145, titled "Selective Internal Gate Structure for Ferroelectric Semiconductor Devices," which is filed on May 24, 2021 and issued as U.S. Pat. No. 11,594,633, which is a continuation of U.S. Non-provisional patent application Ser. No. 16/549,245, titled "Selective Internal Gate Structure for Ferroelectric Semiconductor Devices," which is filed on Aug. 23, 2019 and issued as U.S. Pat. No. 11,018,256, all of which are incorporated herein by reference in their entireties.

BACKGROUND

The semiconductor integrated circuit (IC) industry has experienced exponential growth. Technological advances in IC materials and design have produced generations of ICs, where each generation has smaller and more complex circuits than the previous generation. In the course of the IC evolution, functional density (e.g., the number of interconnected devices per chip area) has generally increased while geometry size (e.g., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

Figure 1:
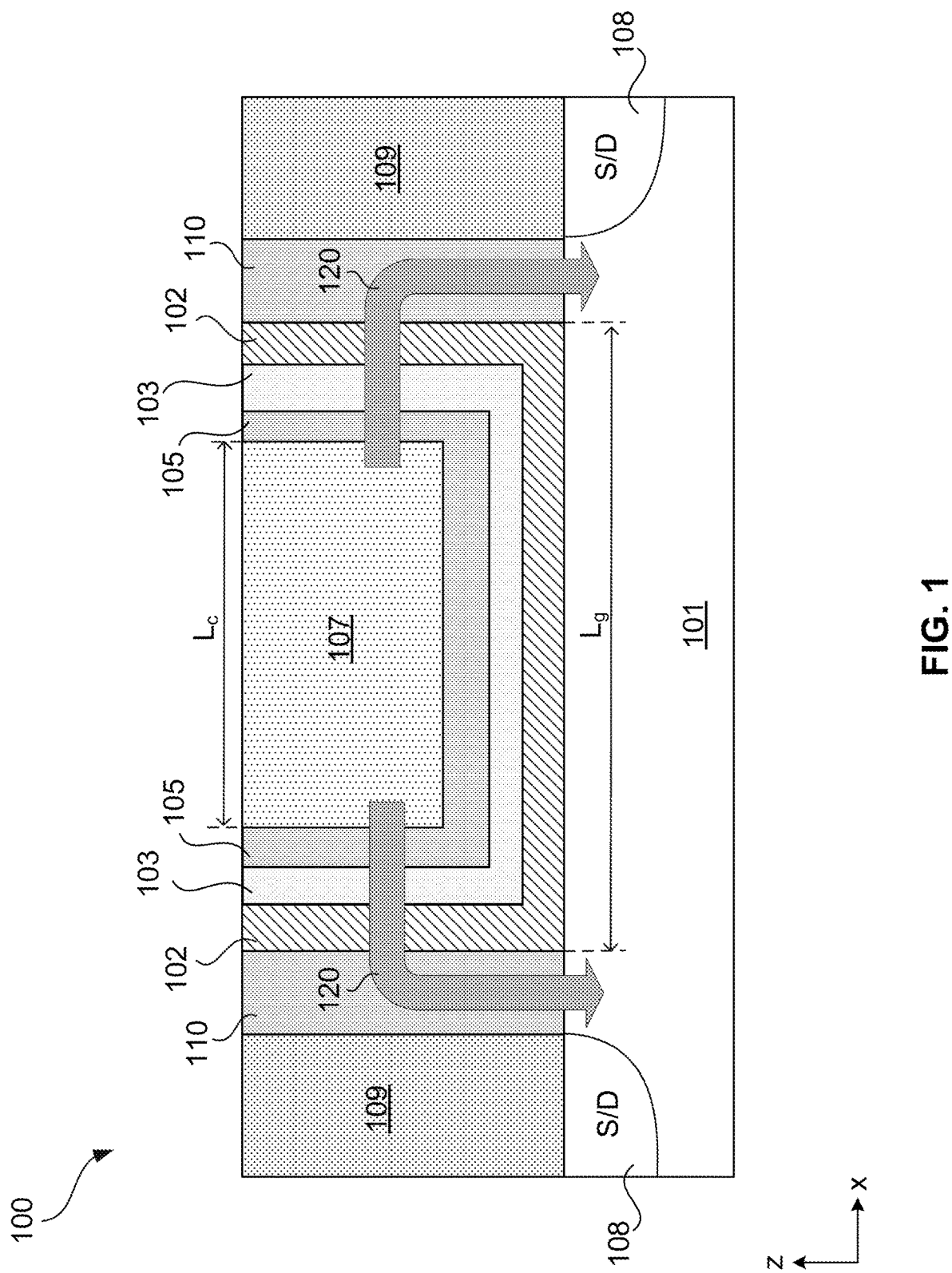
FIG. 1 is a cross-sectional view of a semiconductor device incorporating a ferroelectric dielectric material, in accordance with some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The acronym "FET," as used herein, refers to a field effect transistor. An example of a FET is a metal oxide semiconductor field effect transistor (MOSFET). MOSFETs can be, for example, (i) planar structures built in and on the planar surface of a substrate such as a semiconductor wafer or (ii) built with vertical structures.

The term "FinFET" refers to a FET formed over a fin that is vertically oriented with respect to the planar surface of a wafer.

"S/D" refers to the source and/or drain junctions that form two terminals of a FET.

The term "vertical," as used herein, means nominally perpendicular to the surface of a substrate.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The terms "about" and "substantially" as used herein indicate the value of a given quantity that can vary based on a particular technology node associated with the subject semiconductor device. In some embodiments, based on the particular technology node, the terms "about" and "substantially" can indicate a value of a given quantity that varies within, for example, 5% of the value (e.g., ±1%, ±2%, ±3%, ±4%, ±5% of the value).

The terms "vertical direction" and "horizontal direction" respectively refer to z-direction and x-direction as illustrated in the figures herein.

The performance and scalability of silicon-based transistors are approaching limitations. For example, as device dimensions are scaled down to achieve higher packing density, shrinking silicon-based transistors becomes more challenging. A field effect transistor (FET) device may be used to address these challenges due to its compact form factor and improved performance, such as drive current enhancement and sub-threshold leakage reduction. FET devices can be metal-oxide-semiconductor FETs (MOSFETs).

A fin field effect transistor (finFET) utilizes a vertical device structure. Channel regions of the finFET are formed in fins that protrude from the substrate, and gate structures are disposed over sidewalls and top surfaces of the fins. Gate structures wrapping the channel provide the benefit of controlling the channel regions from, for example, three sides. Although finFETs may exhibit improved performance, they also have their challenges such as high subthreshold swing (SS).

FETs incorporating negative-capacitance (NC) fin field effect transistors (NCFETs) provide a feasible solution to lower power supply (e.g., VDD) and achieves a low SS for low power operation. SS generally describes the amount of voltage required to switch a device on and off, and thus influences the operating speed of the device. Specifically, ferroelectric high-k dielectric materials have been employed to allow devices (e.g., FETs) to operate in a negative capacitance regime (e.g., in a negative-capacitance FET, or NCFET) for improved device performance. In one such example, ferroelectric high-k dielectric materials allow formation of FETs with reduced SS. In many instances, other factors being constant, a reduction in SS generally increases a switching speed of an FET. SS can be controlled by the degree of ferroelectricity of a gate dielectric material included in a gate stack, with a higher ferroelectricity correlating to a lower SS. In addition, ferroelectric high-k dielectric materials can also enlarge a memory window for improved performance of nonvolatile memory devices. Notably, dielectric materials having similar compositions (e.g., all hafnium-based high-k dielectric material) may possess different degrees of ferroelectricity depending upon their specific crystalline phases (distinguished by different space groups, for example). In the example of hafnium-based high-k dielectric material, such as $HfO_2$, ferroelectric orthorhombic phase $Pca2_1$ possesses greater ferroelectricity than its counterpart orthorhombic phases.

Negative capacitance in an NCFET can be achieved by integrating ferroelectric capacitors. Specifically, in an NCFET, a negative capacitor having ferroelectric material is connected to a gate of a FET in series. The ferroelectric negative capacitor can be a separate capacitor connected by a conductive layer (e.g., wire/contact) to the gate of the FET. In some embodiments, one of the electrodes of the negative capacitor is a gate electrode of the MOSFET.

A type of NCFET is a metal-insulator-metal (MIM) NCFET, where an internal gate electrode is inserted between the ferroelectric gate dielectric layer and a non-ferroelectric gate dielectric layer in the gate stack. Suitable high-k dielectric materials (e.g., gate dielectric layers having dielectric constant greater than 3.9) can be used as the non-ferroelectric gate dielectric layer in NCFETs. Work function adjustment metals can be formed above the ferroelectric dielectric layer to adjust the work function of the transistors. While the MIM NCFET presents a number of advantages, it also presents challenges. First, the formation of internal gate electrode and work function layers results in a thickness increase of the gate stack and makes it challenging to form gate structure in a high aspect ratio trench during a replacement gate process. Second, increased thickness also leads to a reduction gate contact area that can increase contact resistance. Third, parasitic capacitance in the gate structure can cause gate leakage that degrades the device's performance. Fourth, for a MIM NCFET device, the gate electrode and internal gate can form a ferroelectric capacitor using the ferroelectric layer as capacitor dielectric and the channel region and internal gate can form a high-k capacitor using the high-k gate dielectric as capacitor dielectric. A mismatch between the first and second capacitors can also degrade device performance.

Various embodiments in accordance with this disclosure provide methods for forming a selectively-grown internal gate for transistor devices. In some embodiments, the transistor devices can be finFETs, NCFETs, nano sheet devices, nano wire devices, and/or other suitable devices. The internal gate can include one or more layers. For example, the internal gate can include a seed layer and a metal layer selectively grown on the seed layer. The selectively-grown internal gate can provide benefits of, among others, (i) reduction in parasitic capacitance which in turn reduces gate leakage by incorporating a horizontal internal gate; (ii) gate area modulation by etching back the high-k dielectric layer; (iii) device performance improvement by matching the capacitance of the ferroelectric capacitor and the high-k capacitor; and (iv) uniform electric field on the ferroelectric layer within a channel region of the transistor device by gate area modulation.

FIG. 1 shows a cross-sectional view of a semiconductor device 100 incorporating an internal gate, in accordance with some embodiments. In some embodiments, semiconductor device 100 can be a vertical FET device. A replacement gate process includes forming an opening in an ILD 109 layer after sacrificial polysilicon is removed. Replacement metal gates are used in scaled finFET-based devices for improved circuit performance. For example, metal gate electrodes can replace polysilicon gate electrodes to achieve reduced gate leakage and improved drive current. One process of implementing metal gates is termed a "gate last" or "replacement gate" process. Such processes include forming a sacrificial polysilicon gate, performing various processes associated with the semiconductor device, removing the sacrificial gate to form a trench or opening, and depositing metal gate material in the trench or opening to form a metal gate.

As shown in FIG. 1, a gate stack is formed between opposing sidewall surfaces of ILD 109 and a top surface of semiconductor substrate 101. In some embodiments, semiconductor substrate 101 can be a fin of a vertical transistor device. In FIG. 1, a high-k dielectric layer 102, an internal gate 103, a ferroelectric dielectric layer 105, and a gate electrode 107 are collectively referred to herein as "a metal gate stack" and is positioned over a semiconductor substrate 101. Spacer 110 is formed on sidewalls of the metal gate stack to facilitate a subsequent source/drain alignment operation. As shown in FIG. 1, high-k dielectric layer 102, internal gate 103, and ferroelectric dielectric layer 105 are lined between semiconductor substrate 101 and gate electrode 107 and also between spacer 110 and gate electrode 107. In some embodiments, in addition to the layers described above, semiconductor device 100 may further include liner layers, seed layers, adhesion layers, barrier layers, work function layers, or their equivalents.

A pair of source/drain (S/D) 108 is formed in the semiconductor substrate 101, and a distance between the source and the drain of S/D 108 is gate length $L_g$. In some embodiments, the gate length $L_g$ of semiconductor device 100 can be about 16 nm. In some embodiments, gate length $L_g$ can be less than about 16 nm. In some embodiments, gate length $L_g$ can be greater than about 16 nm. In some embodiments, gate length $L_g$ can be dependent upon the technology node. For example, gate length $L_g$ can be about 7 nm or about 5 nm. In some embodiments, p-type or n-type work function layers can be formed between gate electrode 107 and substrate 101 to provide various threshold voltages for semiconductor device 100. S/D 108 can be doped with p-type or n-type dopants depending on the device type formed and is not described in detail herein for simplicity.

Semiconductor substrate 101 can be a bulk semiconductor substrate on which various layers and device structure are formed. In some embodiments, semiconductor substrate 101 can include silicon or a compound semiconductor, such as gallium arsenide (GaAs), indium phosphide (InP), silicon germanium (SiGe), silicon carbide (SiC), other suitable semiconductor materials, and/or combinations thereof. In some embodiments, various layers can be formed on semiconductor substrate 101, such as dielectric layers, doped layers, polysilicon layers, conductive layers, other suitable layers, and/or combinations thereof. In some embodiments, various devices can be formed on semiconductor substrate 101, such as transistors, resistors, capacitors, other suitable devices, and/or combinations thereof. In some embodiments, semiconductor substrate 101 can be a fin of a vertical transistor device. In some embodiments, semiconductor substrate 101 can be a device layer containing other suitable devices.

ILD 109 can include a dielectric material. In some embodiments, the dielectric material can include silicon oxide, silicon nitride, silicon oxynitride, spin-on glass (SOG), fluorinated silica glass (FSG), carbon doped silicon oxide (e.g., SiCOH), amorphous fluorinated carbon, Parylene, bis-benzocyclobutenes, polyimide, other proper porous polymeric materials, other suitable dielectric materials, and/or combinations thereof. In some embodiments, ILD 109 can include a high density plasma (HDP) dielectric material (e.g., HDP oxide) and/or a high aspect ratio process (HARP) dielectric material (e.g., HARP oxide). ILD 109 can also include one or more dielectric materials and/or one or more dielectric layers. One or more planarization process can be used to planarize the top surface of ILD 109. During a gate replacement process, ILD 109 can be planarized by a chemical mechanical polishing (CMP) process until a top portion of a polysilicon gate is exposed. After the polysilicon gate is replaced with a metal gate, such as gate electrode 107, another CMP process can be performed to planarize the top surfaces of the gate electrode, spacers, 110, and ILD 109. The CMP process includes a high selectivity to provide a substantially planar surface for the metal gate stack, spacers 110, and ILD 109. In some embodiments, the CMP process has low dishing and/or metal erosion effect.

Spacers 110 can be formed on opposing surfaces of ILD 109 and on surface of substrate 101. Spacers 110 can include a plurality of sub-spacers and are not illustrated in FIG. 1 for clarity. Spacers 110 can be formed using dielectric material, such as silicon oxide, silicon nitride, silicon oxynitride, any other suitable dielectric material, and/or combinations of the same. Spacers 110 can be formed by blanket depositing a dielectric material and anisotropically etching the dielectric material such that the remaining dielectric material is formed on sidewalls of ILD 109.

High-k dielectric layer 102 can be formed on a top surface of substrate 101 and on sidewall surfaces of spacers 110, in accordance with some embodiments. High-k dielectric layer 102 can include a dielectric material having dielectric constant greater than about 3.9. In some embodiments, high-k dielectric layer 102 can include hafnium oxide. In some embodiments, high-k dielectric layer 102 can be in a crystalline form. High-k dielectric layer 102 can be formed by chemical oxidation, thermal oxidation, atomic layer deposition (ALD), chemical vapor deposition (CVD), any other suitable deposition methods, and/or combinations thereof. In some embodiments, high-k dielectric layer can be formed using amorphous material.

Internal gate 103 can be a metal layer formed on high-k dielectric layer 102. In some embodiments, internal gate 103 can extend vertically (e.g., z direction) and horizontally (e.g., x direction). Internal gate 103 can be formed of tungsten, copper, titanium, silver, aluminum, titanium aluminide, titanium aluminide nitride, tantalum carbide, tantalum carbide nitride, tantalum silicide nitride, manganese, cobalt, palladium, nickel, rhenium, platinum, titanium nitride, tungsten nitride, tantalum nitride, any suitable conductive material, and/or combinations thereof. In some embodiments, internal gate 103 can be formed of metal alloys such as titanium aluminum alloy, rhenium tantalum alloy, rhenium zirconium alloy, platinum titanium alloy, cobalt nickel alloy, tungsten nitride alloy, titanium nitride alloy, molybdenum nitride alloy, tantalum nitride alloy, tantalum silicon nitride alloy, any suitable metal alloys, and/or combinations thereof.

Ferroelectric dielectric layer 105 can be a suitable crystalline material having ferroelectric properties. In some embodiments, ferroelectric dielectric layer 105 can have be a high-k dielectric layer having dielectric constant greater than 3.9. For example, ferroelectric dielectric layer 105 can include a high-k dielectric material, such as a hafnium-based oxide material. In some embodiments, ferroelectric dielectric layer 105 can include hafnium dioxide ($HfO_2$). Other suitable crystalline ferroelectric dielectric material can be used. Ferroelectric dielectric layer 105 can be formed by any suitable process, such as by ALD, CVD, metalorganic CVD (MOCVD), physical vapor deposition (PVD), plasma enhanced CVD (PECVD), plasma enhance ALD (PEALD), thermal oxidation, any other suitable deposition techniques, and/or combinations thereof. In some embodiments, ferroelectric dielectric layer 105 can have a thickness between about 40 Å and about 80 Å.

Gate electrode 107 is formed on ferroelectric dielectric layer 105 to form a metal gate stack. In some embodiments, gate electrode 107 can be referred to as a metal gate electrode. In some embodiments, work function layers can be formed between high-k dielectric layer 102 and gate electrode 107. Gate electrode 107 can include any metal material suitable for forming a metal gate or portion thereof. For example, gate electrode 107 can include tungsten. In some embodiments, gate electrode 107 can be formed using tungsten nitride (WN), TaN, ruthenium, silver, aluminum, any other suitable material, and/or combinations thereof. In some embodiments, gate electrode 107 can be formed using a damascene process followed by a planarization process (e.g., a CMP process) to remove any excessive material formed on the top surface of ILD 109. In some embodiments, a gate electrode length $L_c$ of gate electrode 107 can be between about 80 Å and about 100 Å. For example, gate electrode length $L_c$ can be about 90 Å. A ratio of lengths $L_c$ over $L_g$ can be between about 0.4 and about 0.7.

As portions of the internal gate 103 extends vertically (e.g., z direction), it can induce parasitic capacitance that causes undesirable gate leakage paths through spacer 110 and into substrate 101. As shown in FIG. 1, this vertical configuration of internal gate 103 induces a gate leakage path (illustrated by arrows 120) to be created between gate electrode 107 and substrate 101. The gate leakage path reduces device performance and may lead to device failure. Additionally, the vertical configuration also reduces valuable horizontal contact area of gate electrode 107 for subsequent formation of contact structures, which in turn increases contact resistance.

Figure 2:
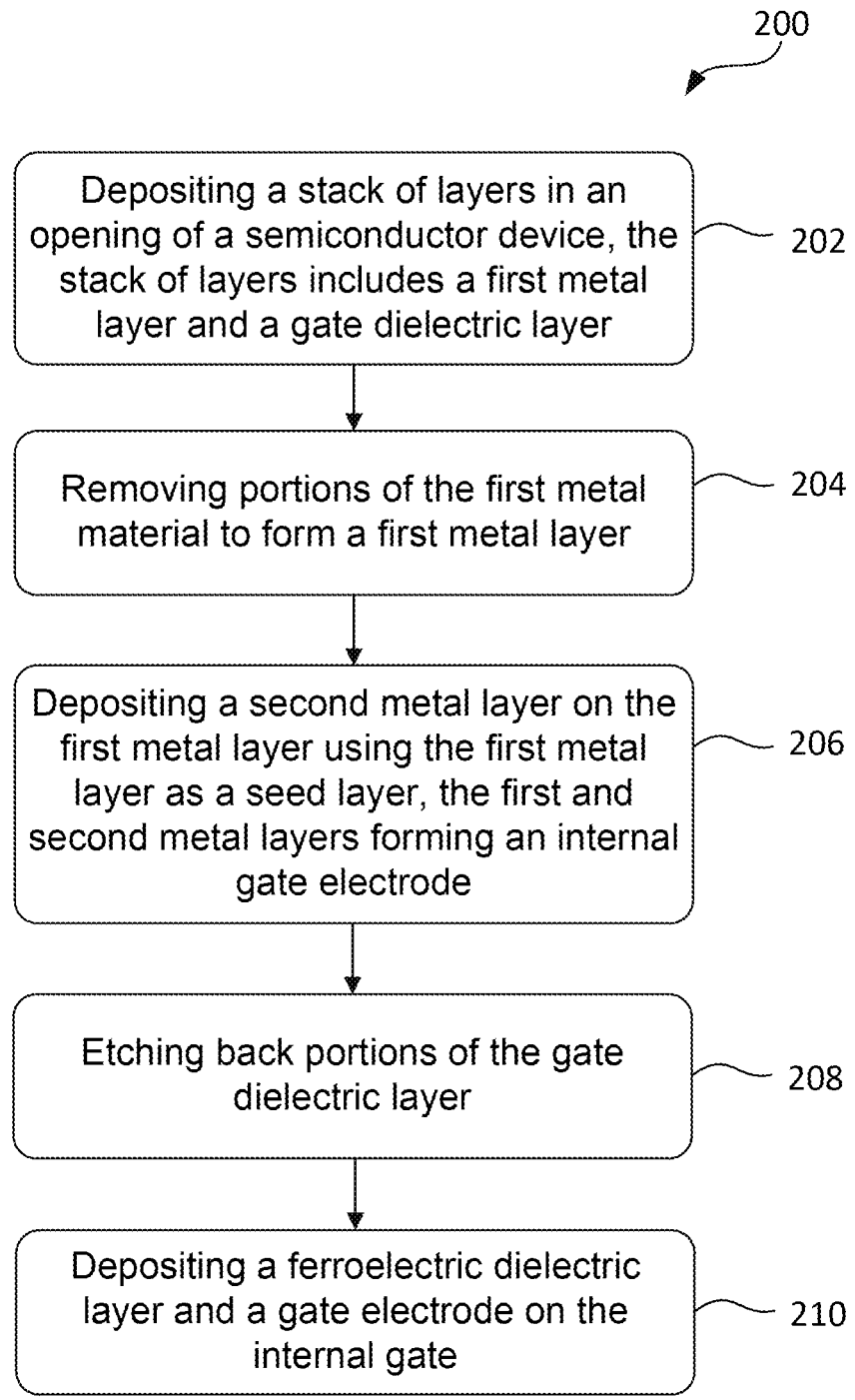
FIG. 2 is a flow diagram of a method for forming a selectively-deposited internal gate, in accordance with some embodiments.

FIG. 2 is a flow diagram of a method 200 for forming selectively-deposited internal gate structure in semiconductor devices, in accordance with some embodiments of the present disclosure. It should be noted that operations of method 200 can be performed in a different order and/or vary, and method 200 may include more operations and are not described for simplicity. FIGS. 3A-3E are cross-sectional views of fabricating an exemplary semiconductor structure 300 incorporating a selectively-deposited internal gate structures. Semiconductor structure 300 can include NCFET and/or FeFET devices. FIGS. 3A-3E are provided as exemplary cross-sectional views to facilitate in the explanation of method 200. Semiconductor structure 300 can include substrate 301, S/D 308, ILD 309, and spacer 310, which are respectively similar to substrate 101, S/D 108, ILD 109, and spacer 110, as described above in FIG. 1 and are not described in detail here for simplicity. In some embodiments, substrate 301 can include a portion of a fin of a finFET device.

Although fabrication processes of planar devices and/or finFET are described here as examples, the fabrication process can be applied in various semiconductor structures, such as trenches or gaps, single-fin finFETs, and any other suitable semiconductor structure. The fabrication processes provided here are exemplary, and alternative processes in accordance with this disclosure may be performed that are not shown in these figures.

At operation 202, a stack of layers are deposited in openings of a semiconductor device, in accordance with some embodiments of the present disclosure. The opening can have a high aspect ratio (e.g., greater than 6). The opening can be gate trenches and other suitable high aspect ratio openings. In some embodiments, the openings can be formed between opposing sidewalls of the spacers and exposing a top surface of a substrate. In some embodiments, the opening can expose a top surface of a fin formed as a portion of a substrate. In some embodiments, the stack of layers can include a first metal layer and a gate dielectric layer.

Figure 3A:
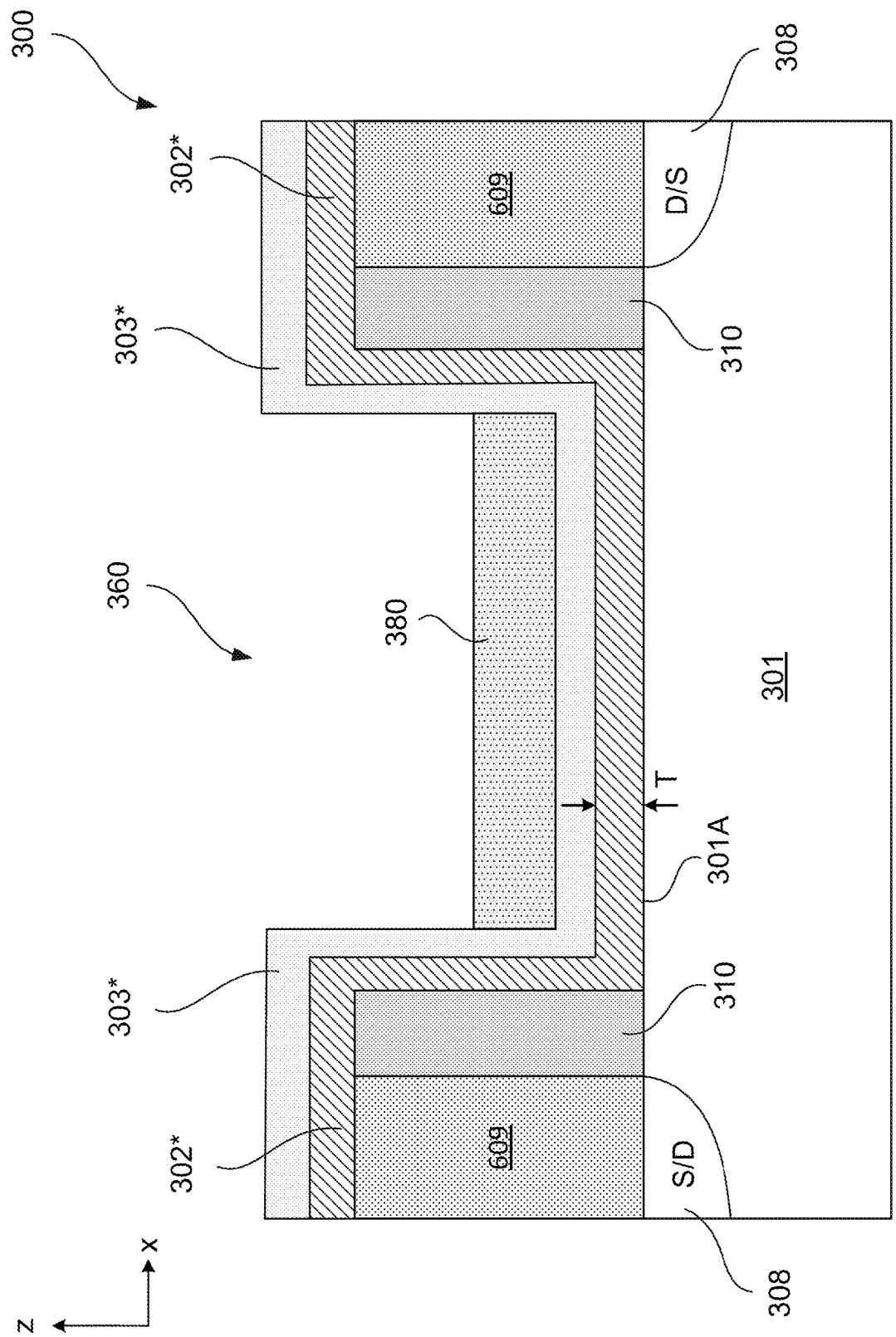
FIGS. 3A-3E are cross-sectional views of semiconductor structures, in accordance with some embodiments.

Referring to FIG. 3A, a high-k dielectric material 302* and a first metal material 303* are deposited in a gate trench 360 formed between sidewalls of spacers 310 and on top surface 301A of substrate 301. High-k dielectric material 302* can be used as gate dielectric and formed of dielectric material having dielectric constant greater than about 3.9. For example, high-k dielectric material 302* can be formed of a hafnium-based oxide material, such as hafnium dioxide. In some embodiments, high-k dielectric material 302* can be formed using oxygen-deficient hafnium oxide. High-k dielectric material 302* can be formed using material similar to high-k dielectric layer 102 described above in FIG. 1. In some embodiments, high-k dielectric material 302* can have a thickness T between about 10 Å and about 30 Å. For example, thickness T can be between about 10 Å and about 20 Å, between about 20 Å and about 30 Å, or any suitable thickness ranges depending on device design. First metal material 303* can be formed using suitable metal materials that can be used as a seed layer for subsequent metal deposition. For example, first metal material 303* can be formed using highly-conductive TiN. In some embodiments, first metal material 303* can be formed using silver, aluminum, gold, cobalt, tungsten, any suitable conductive material, and/or combinations thereof. In some embodiments, first metal material 303* can be formed using copper, or one of copper alloys that include silver, chromium, nickel, tin, gold, and combinations thereof. In some embodiments, thickness of first metal material 303* can be between about 1 Å and about 10 Å. A lower thickness of first metal material 303* can reduce the etching time needed for subsequent removal of portions of first metal material 303*. In some embodiments, first metal material 303* can have a thickness between about 1 Å and about 3 Å, between about 3 Å and about 5 Å, between about 5 Å and about 10 Å, or any other suitable ranges. High-k dielectric material 302* and first metal material 303* can be deposited using a substantially conformal deposition method, such as ALD. In some embodiments, high-k dielectric material 302* and first metal material 303* can be formed by any suitable process, such as CVD, MOCVD, PVD, PECVD, PEALD, thermal oxidation, any other suitable deposition techniques, and/or combinations thereof.

In some embodiments, high-k dielectric material 302* can be deposited using ALD or CVD at a temperature between about 150° C. and about 300° C. For example, the deposition temperature can be between about 150° C. and about 200° C., between about 200° C. and about 300° C., or any suitable temperature ranges. In some embodiments, first metal material 303* can be deposited at a different temperature as high-k dielectric layer 302*. For example, the deposition of first metal material can be ALD or CVD processes performed at temperature between about 300° C. and about 600° C. For example, the deposition temperature can be between about 300° C. and about 400° C., between about 400° C. and about 500° C., between about 500° C. and about 600° C., or any suitable temperature ranges. In some embodiments, the deposition processes can be performed in one or more suitable chambers of a semiconductor wafer processing cluster tool.

A blocking layer 380 can be deposited on the bottom of trench 360 after high-k dielectric material 302* and first metal material 303* are deposited. Blocking layer 380 is used to protect the underlying layers, such as high-k dielectric material 302* and first metal material 303*, during subsequent processes. In some embodiments, blocking layer 380 can be formed using bottom anti-reflective coating (BARC) material. In some embodiments, blocking layer 380 can be formed using a blanket deposition of blocking material followed by an etch back process, such as a recess process where blocking layer 380 remains only at the bottom of trench 360.

Figure 3B:
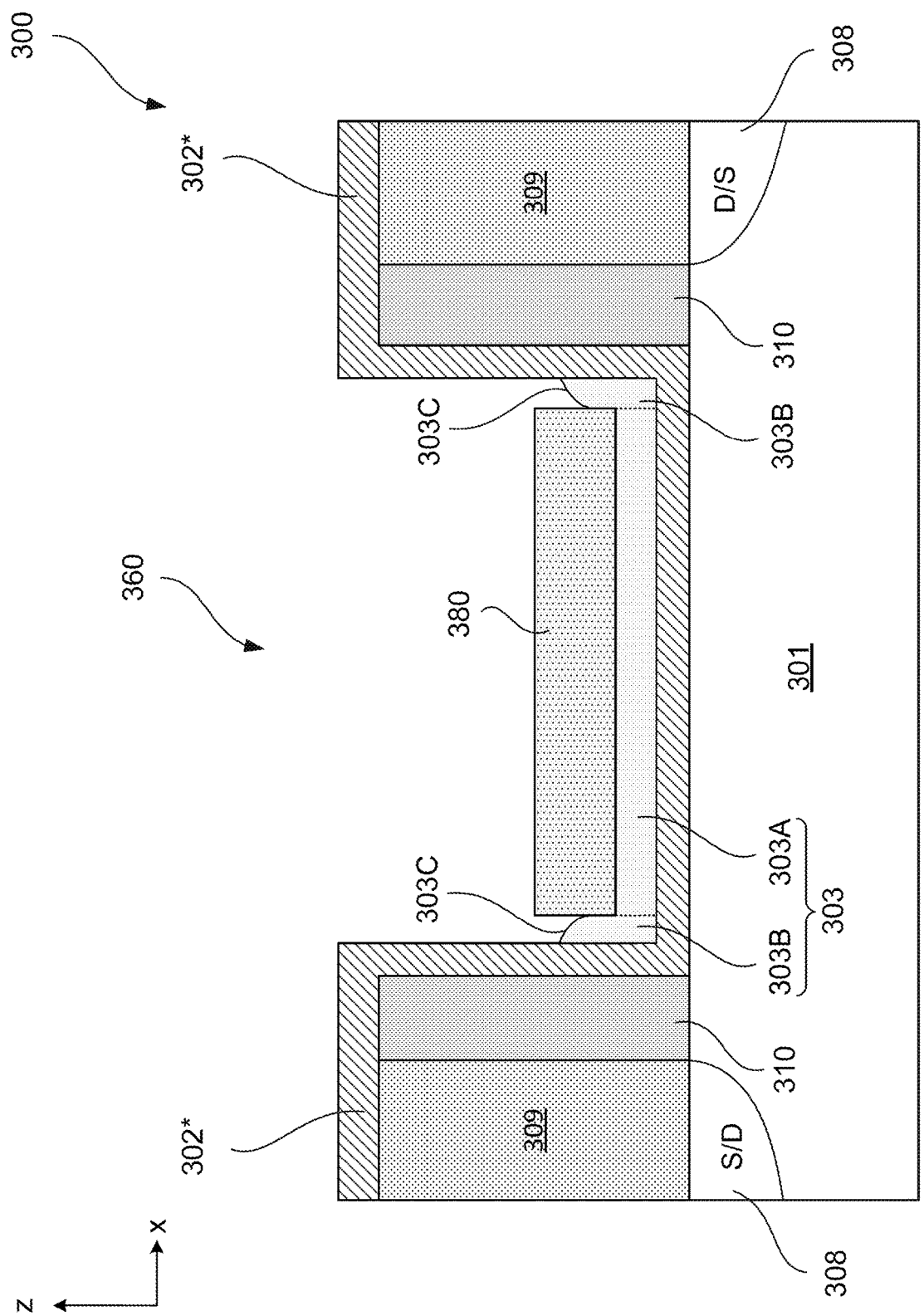

Referring to FIG. 2, at operation 204, portions of first metal is removed to form a first metal layer, in accordance with some embodiments of the present disclosure. Referring to FIG. 3B, an etching process is performed on semiconductor device 300 to etch back first metal material 303*. Portions of first metal material 303* exposed and not protected by blocking layer 380 are removed by suitable etching processes. For example, a wet chemical etching process can be performed. The wet chemical process can be a timed process until exposed portions of first metal material 303* are etched away. In some embodiments, the wet chemical etching process can proceed to over etch that can remove additional portions of first metal material 303* formed between blocking layer 380 and high-k dielectric material 302*, as illustrated in FIG. 3B. In some embodiments, the wet chemical etch can use an oxidant-containing solution (e.g., hydrogen peroxide). In some embodiments, the wet chemical etch can be performed at an elevated temperature to facilitate chemical reaction. For example, the etching temperature can be between about 40° C. and about 150° C. In some embodiments, the etching temperature can be between about 40° C. and about 60° C. As such, remaining first metal material 303* can form first metal layer 303 that includes a horizontal portion 303A and a vertical portions 303B. Horizontal portion 303A extends in the horizontal direction (e.g., x direction). Vertical portions 303B extend in the vertical direction (e.g., z direction). Due to over etching, the upper surface 303C of vertical portions 303B can be below a top surface of blocking layer 380 and can be a curved surface. In some embodiments, upper surface 303C can be substantially level with the top surface of blocking layer 380. Blocking layer 380 is subsequently removed using suitable processes, such as a wet chemical etching process that has high selectivity of blocking material over high-k dielectric material 302* and underlying first metal layer 303.

Figure 3C:
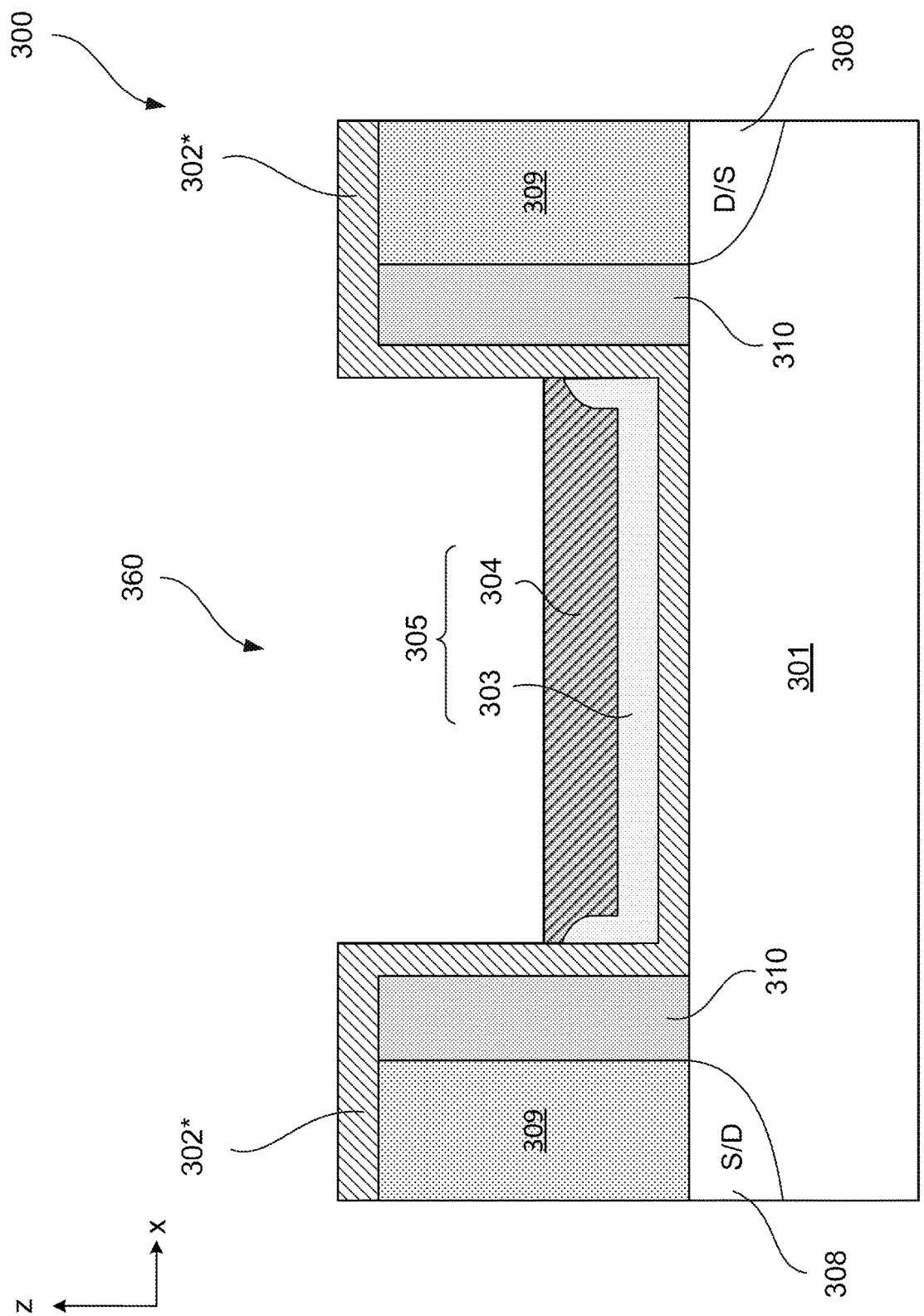

Referring to FIG. 2, at operation 206, a second metal layer 304 is selectively deposited on first metal layer 303 using the first metal layer as a seed layer such that the first and second metal layers form an internal gate 305, in accordance with some embodiments of the present disclosure. As shown in FIG. 3C, second metal layer 304 can be deposited in trench 360 and on first metal layer 303 using a selective deposition process, according to some embodiments. For example, a selective tungsten chemical vapor deposition process can be performed to selectively deposit tungsten in trench 360. Specifically, a cleaning process using hydroxylamine sulfate combined with copper sulfate ($CuSO_4$) can be performed on first metal layer 303 formed of aluminum. The copper ions in the solution react with the aluminum surface and form a copper passivating layer which assists tungsten nucleation during a CVD tungsten deposition where tungsten is formed on exposed surface of first metal layer 303. Other suitable selective growth method can also be used. For example, a self-assembly mono-layer (SAM) deposition can be used where material forming second metal layer 304 is attracted to the surfaces of first metal layer 303. In some embodiments, as second metal layer 304 is deposited and accumulated on first metal layer 303, second metal layer 304 gradually fills trench 360. After the deposition process, second metal layer 304 is also deposited on and in physical contact with high-k dielectric material 302*. In some embodiments, an electroplating or electroless plating process can be used to selectively deposit second metal layer 304 in trench 360 and on first metal layer 303.

Figure 3D:
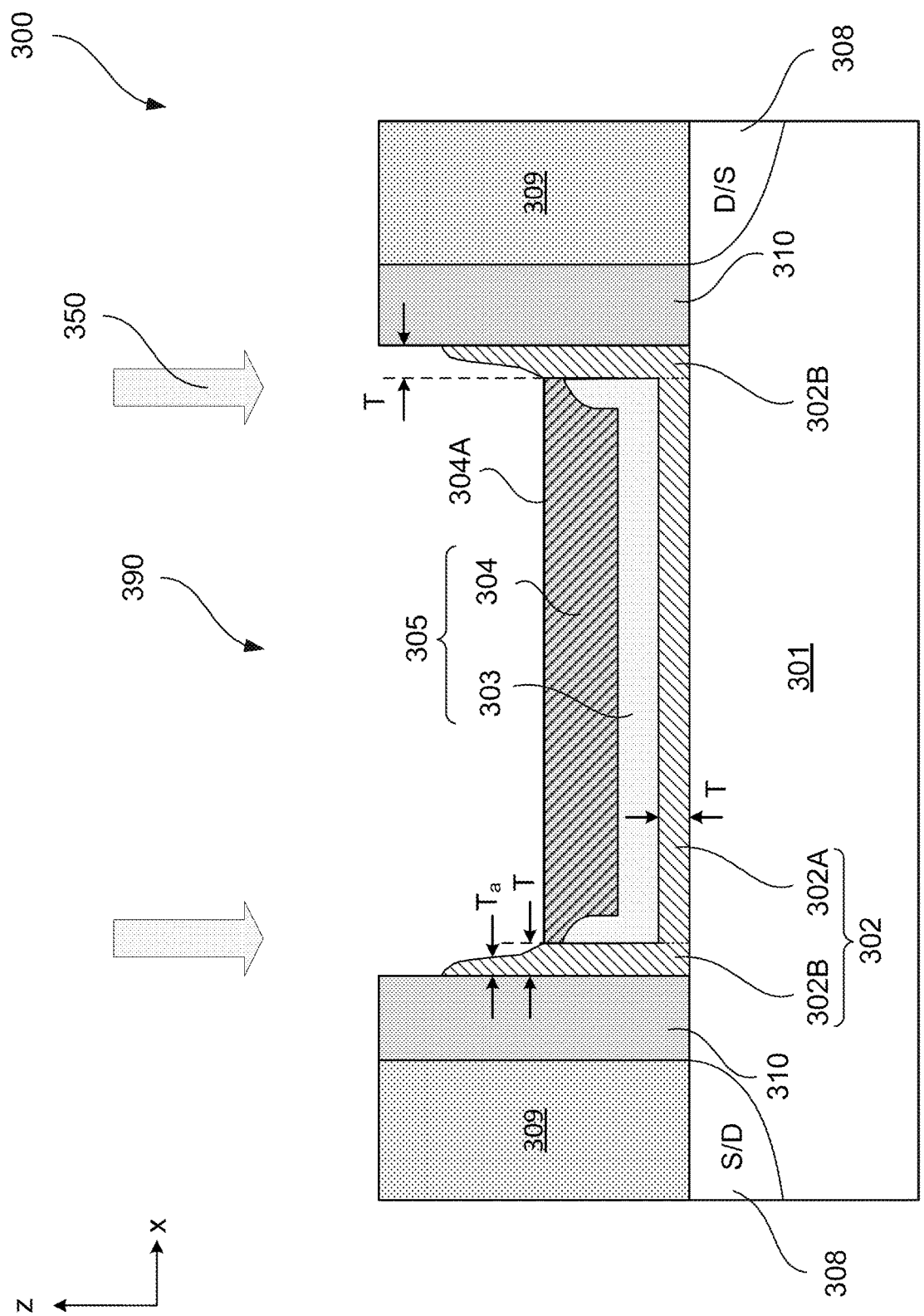

Referring to FIG. 2, at operation 208, portions of gate dielectric layer are etched back, in accordance with some embodiments of the present disclosure. As shown in FIG. 3D, high-k dielectric material 302* is etched back to form high-k dielectric layer 302 that includes a horizontal portion 302A and vertical portions 302B. Horizontal portion 302A extends in the horizontal direction (e.g., x direction) and is formed between first metal layer 303 and substrate 301. Vertical portion 302B extends in the vertical direction (e.g., z direction) and is formed between spacers 310 and internal gate 305. In some embodiments, vertical portion 302B extends above a top surface of internal gate 305. The etching back of high-k dielectric material 302* forms an opening 390 between opposing spacers 310 and remaining high-k dielectric material 302*. The etching back process can be an anisotropic etch process 350 which has a greater etching rate in the vertical direction than the horizontal direction. As such, high-k dielectric material 302* formed on top surfaces of ILD 309 and spacers 310 are first removed, while high-k dielectric material 302* formed on sidewalls of spacers 310 are gradually removed, and its remaining portion form vertical portions 302B. As the etching back process continues, a thickness of vertical portion 302B that remains above top surface 304A of internal gate 305 continues to be reduced. As shown in FIG. 3D, exposed surface of vertical portion 302B that extends above top surface 304A of second metal layer 304 can have a non-linear surface (e.g., curved surface). For simplicity, thickness Ta is an average thickness of vertical portion 302B that remains above top surface of internal gate 305. As opening 390 is subsequently filled by the ferroelectric dielectric layer and the gate electrode, the etch back process can be controlled such that the outline of opening 390 takes a shape that meets the design requirements for the subsequently formed ferroelectric dielectric layer and the gate electrode. For example, a lower average thickness Ta would result in opening 390 having a greater width, which in turn can increase the width of subsequently formed gate electrode. The lower average thickness Ta can be achieved by a greater etching time and/or higher etching rate of etching process 350. In addition, the contours of vertical portion 302B that remains above top surface 304A can be adjusted through the etch back process such that a capacitance match can be achieved between the high-k capacitor and the subsequently formed ferroelectric capacitor. In some embodiments, a ratio of average thickness Ta over thickness T of high-k dielectric material 302* can be between about 5% and about 10%, about 10% and about 20%, about 20% and about 30%, about 30% and about 40%, about 40% and about 50%, about 50% and about 60%, about 60% and about 70%, about 70% and about 80%, about 80% and about 90%, about 90% and about 99%, or any other suitable ranges. In some embodiments, the ratio of average thickness Ta over thickness T of high-k dielectric material 302* can be about 50%.

Figure 3E:
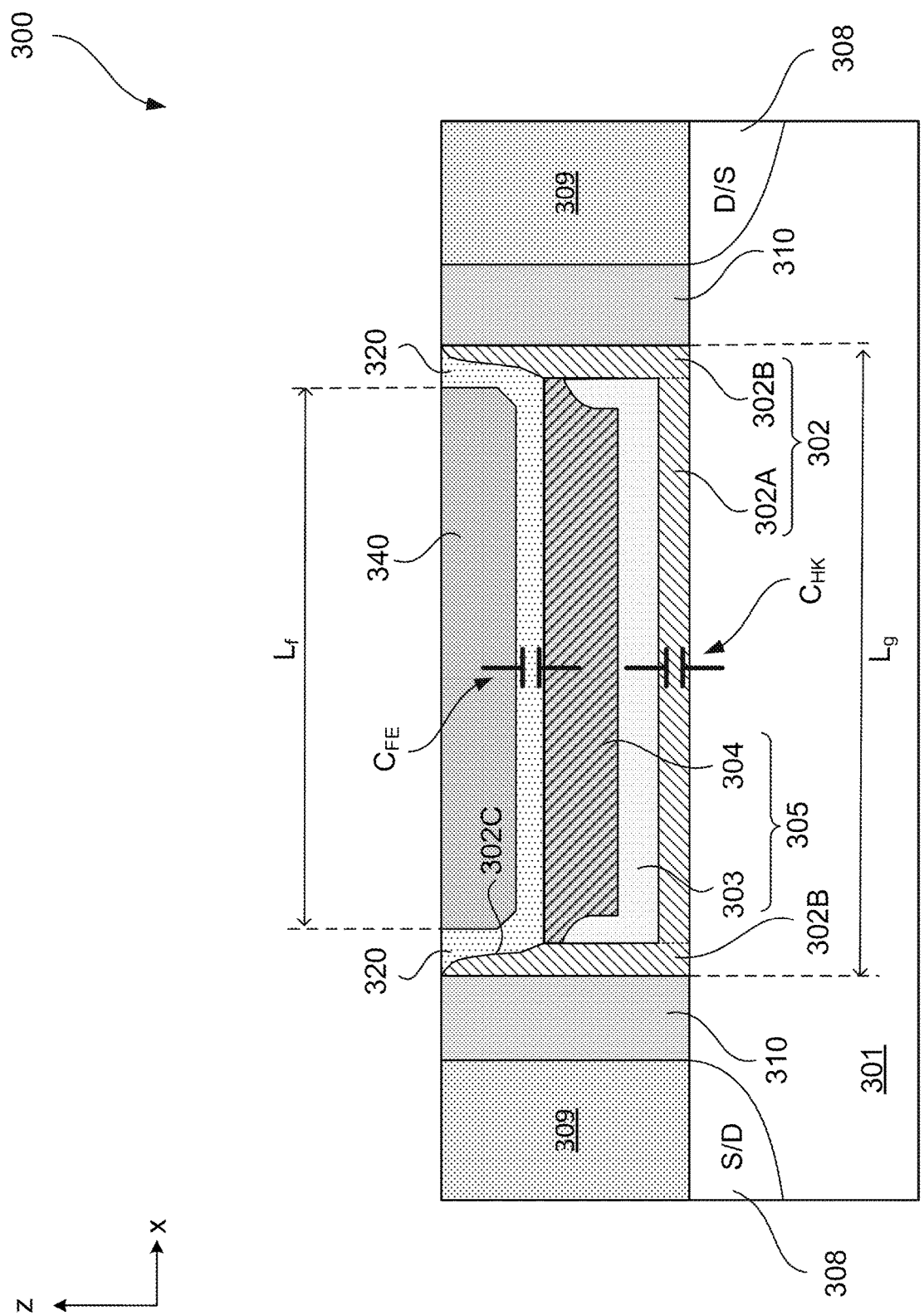

Referring to FIG. 2, at operation 210, a ferroelectric layer and a gate electrode are deposited on the internal gate, according to some embodiments of the present disclosure. As shown in FIG. 3E, ferroelectric dielectric layer 320 is disposed on internal gate 305 and between vertical portions 302B of high-k dielectric layer 302. In some embodiments, ferroelectric dielectric layer 320 is in physical contact with vertical portions 302B through a non-linear surface 302C. Gate electrode 340 is subsequently deposited on ferroelectric dielectric layer 320. Specifically, gate electrode 340 is deposited in the opening formed between opposing sidewall portions and horizontal portions of ferroelectric dielectric layer 320. In some embodiments, ferroelectric dielectric layer 320 can be formed using a layer that provides ferroelectric properties. For example, ferroelectric dielectric layer 320 can be formed using crystalline hafnium oxide. In some embodiments, ferroelectric dielectric layer 320 can be deposited using a substantially conformal deposition method, such as an ALD or CVD method. In some embodiments, the composition and deposition method for forming ferroelectric dielectric layer 320 can be similar to those of ferroelectric layer 105 described above in FIG. 1.

Gate electrode 340 can include tungsten, WN, TaN, ruthenium, silver, aluminum, any other suitable material, and/or combinations thereof. Gate electrode 340 can be formed using a damascene process followed by a planarization process to remove any excessive material deposited. An example of the planarization process is a CMP process. In some embodiments, the planarization process can also reduce the height of ILD 309 and spacers 310. The planarization process can continue until top surfaces of ILD 309, spacer 310, ferroelectric dielectric layer 320, and gate electrode 340 are substantially level (e.g., coplanar). In some embodiments, portions of vertical portions 302B can also be exposed after the planarization process. In some embodiments, vertical portions 302B are covered by ferroelectric dielectric layer 320. After the planarization process, a gate stack can be formed including high-k dielectric layer 302, internal gate 305, ferroelectric dielectric layer 320, and gate electrode 340.

The configuration of semiconductor device 300 illustrated in FIG. 3E can provide several benefits. For example, gate area modulation by etching back high-k dielectric layer can provide reduced gate contact resistance, capacitance matching, uniform electric field, among others. First, gate electrode 340 may have a greater gate electrode length $L_f$ than the gate electrode length $L_c$ described above in FIG. 1 due to etching back of high-k dielectric layer and a horizontal internal gate. In some embodiments, ratio of gate length $L_f$ over gate length $L_g$ can be between about 0.4 and about 0.7. In some embodiments, gate length $L_g$ can be between about 15 nm and about 20 nm. For example, gate length $L_g$ can be about 17 nm. A greater gate electrode length $L_f$ provides greater surface area for subsequently formed gate contacts which in turn reduces gate contact resistance. Second, capacitances of ferroelectric capacitor $C_{FE}$ and high-k capacitor $C_{HK}$ can be matched by gate area modulation. As illustrated in FIG. 3E, gate electrode 340 and internal gate 305 can form a ferroelectric capacitor $C_{FE}$ using ferroelectric dielectric layer 320 as capacitor dielectric and substrate 301 and internal gate 305 can form a high-k capacitor $C_{HK}$ using high-k gate dielectric 302 as capacitor dielectric. By adjusting gate electrode length $L_f$, capacitance of ferroelectric capacitor $C_{FE}$ can be adjusted to match the capacitance of high-k capacitor $C_{HK}$. In addition, the non-linear surface of vertical portions 302B of high-k dielectric layer and the resulting non-linear surface of ferroelectric layer 320 thereon reduce sharp corners and provide uniform electric field between gate electrode 340 and internal gate 305, which in turn improves device performance. Third, by employing a horizontal internal gate 305 as illustrated in FIG. 3E, parasitic capacitance and resulting gate leakage 120 as illustrated in FIG. 1 can be avoided which in turn improves device performance.

Various embodiments in accordance with this disclosure provide methods for forming a selectively-grown internal gate for transistor devices. In some embodiments, the transistor devices can be finFETs, NCFETs, nano sheet devices, nano wire devices, and other suitable devices. The selectively-grown internal gate can provide benefits of, among others, (i) reduction in parasitic capacitance which in turn reduces gate leakage by incorporating a horizontal internal gate; (ii) gate area modulation by etching back the high-k dielectric layer using the internal gate as an etch stop layer; (iii) device performance improvement by matching the capacitance of the ferroelectric capacitor and the high-k capacitor; and (iv) uniform electric field on the ferroelectric layer within a channel region of the transistor device by gate area modulation.

In some embodiments, a semiconductor device includes a substrate and first and second spacers on the substrate. The semiconductor device also includes a gate stack between the first and second spacers. The gate stack includes a gate dielectric layer having a first portion formed on the substrate and a second portion formed on the first and second spacers; an internal gate formed on the first and second portions of the gate dielectric layer; a ferroelectric dielectric layer formed on the internal gate and in contact with the gate dielectric layer; and a gate electrode on the ferroelectric dielectric layer.

In some embodiments, a method for forming a semiconductor device includes forming first and second spacers and depositing a gate dielectric layer between the first and second spacers and on sidewalls of the first and second spacers. The method also includes forming an internal gate on the gate dielectric layer. Forming the internal gate includes forming a first metal layer on the gate dielectric layer and selectively depositing a second metal layer on the first metal layer using a selective chemical vapor deposition (CVD) process. The method also includes depositing a ferroelectric dielectric layer on the internal gate and gate dielectric layer. The method further includes forming a gate electrode on the ferroelectric dielectric layer.

In some embodiments, a method for forming a semiconductor device includes forming a fin and forming first and second spacers on the fin. The method also includes depositing a gate dielectric layer on the fin and on sidewalls of the first and second spacers and forming an internal gate on the gate dielectric layer. Forming the internal gate includes depositing a first metal layer on the gate dielectric layer and forming a blocking layer on portions of the first metal layer. Forming the internal gate includes removing portions of the first metal layer not covered by the blocking layer and removing the blocking layer and selectively depositing a second metal layer on the first metal layer. The method further includes etching back the gate dielectric layer and depositing a ferroelectric dielectric layer on the internal gate and gate dielectric layer. The method also includes forming a gate electrode on the ferroelectric dielectric layer.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A device, comprising:
   first and second spacers on a substrate;
   a high-k capacitor between the first and second spacers, wherein the high-k capacitor comprises:
   a high-k dielectric layer on the substrate and sidewalls of the first and second spacers; and
   an internal gate on the high-k dielectric layer; and
   a ferroelectric capacitor on the high-k capacitor, wherein the ferroelectric capacitor comprises:
   a ferroelectric dielectric layer on the internal gate, wherein a side surface of the ferroelectric dielectric layer comprises a convex portion and a concave portion, and wherein an interface between the internal gate and the ferroelectric dielectric layer is in contact with a boundary between a side surface of the internal gate and the convex portion of the side surface of the ferroelectric dielectric layer; and
   an electrode on the ferroelectric dielectric layer.

2. The device of claim 1, wherein the ferroelectric dielectric layer is in contact with a non-linear surface of the high-k dielectric layer.

3. The device of claim 1, wherein the internal gate comprises:
   a first metal layer on the high-k dielectric layer and sidewalls of the high-k dielectric layer; and
   a second metal layer on the first metal layer and in contact with the sidewalls of the high-k dielectric layer, wherein the first metal layer is separated from the ferroelectric dielectric layer by the second metal layer.

4. The device of claim 3, wherein the first and second metal layers comprise different materials.

5. The device of claim 3, wherein the second metal layer is in contact with a non-linear surface of a vertical portion of the first metal layer.

6. The device of claim 1, wherein a ratio of a length of the electrode and a length of the high-k dielectric layer is between about 0.4 and about 0.7.

7. The device of claim 1, wherein the convex portion of the side surface of the ferroelectric dielectric layer is below a bottom surface of the electrode.

8. The device of claim 1, wherein the convex portion is in contact with the high-k dielectric layer and the internal gate.

9. A device, comprising:
a fin on a substrate;
a high-k capacitor on the fin and having a first capacitance, wherein the high-k capacitor comprises:
a high-k dielectric layer; and
an internal gate on the high-k dielectric layer; and
a ferroelectric capacitor on the high-k capacitor, wherein the ferroelectric capacitor comprises:
a ferroelectric dielectric layer on the internal gate, wherein a convex side surface of the ferroelectric dielectric layer is in contact with a top surface of the internal gate and a side surface of the high-k dielectric layer; and
an electrode on the ferroelectric dielectric layer, wherein a bottom surface of the electrode is below a portion of the convex side surface of the ferroelectric dielectric layer.

10. The device of claim 9, wherein the internal gate comprises:
a first metal layer on the high-k dielectric layer; and
a second metal layer on the first metal layer and in contact with a linear sidewall of the high-k dielectric layer, wherein an interface between the ferroelectric dielectric layer and the second metal layer is connected to the linear sidewall of the high-k dielectric layer and the convex side surface of the ferroelectric dielectric layer.

11. The device of claim 10, wherein the second metal layer is in contact with a non-linear surface of the first metal layer.

12. The device of claim 9, wherein an interface between the internal gate and the ferroelectric dielectric layer is in contact with a boundary between the convex side surface of the ferroelectric dielectric layer and a linear sidewall of the high-k dielectric layer.

13. The device of claim 9, wherein a ratio of a length of the electrode and a length of the high-k dielectric layer is between about 0.4 and about 0.7.

14. The device of claim 9, wherein a ratio of an average thickness of a sidewall of the high-k dielectric layer and a thickness of a horizontal portion of the high-k dielectric layer is between about 30% and about 70%.

15. A method, comprising:
forming first and second spacers on a substrate;
forming a high-k capacitor between the first and second spacers, comprising:
forming a high-k dielectric layer on the substrate and sidewalls of the first and second spacers; and
forming an internal gate on the high-k dielectric layer; and
forming a ferroelectric capacitor, comprising:
forming, on the internal gate, a ferroelectric dielectric layer, wherein forming the ferroelectric dielectric layer comprises forming a first side portion of the ferroelectric dielectric layer and forming a second side portion of the ferroelectric dielectric layer on the first side portion, wherein the second side portion has a horizontal width greater than a horizontal width of the first side portion, and wherein a convex surface of the first side portion is in contact with the high-k dielectric layer and the internal gate; and
forming an electrode on an upper surface of the ferroelectric dielectric layer.

16. The method of claim 15, wherein forming the high-k dielectric layer comprises recessing a portion of the high-k dielectric layer to form a concave surface of the high-k dielectric layer.

17. The method of claim 15, wherein forming the high-k dielectric layer comprises adjusting an average thickness of a vertical portion of the high-k dielectric layer.

18. The method of claim 15, wherein forming the electrode comprises controlling a length of the electrode based on a length of the high-k dielectric layer.

19. The method of claim 15, wherein forming the internal gate comprises:
forming a metal layer on the high-k dielectric layer;
forming a blocking layer on the metal layer; and
etching back a vertical portion of the metal layer exposed by the blocking layer to form another non-linear surface on the vertical portion of the metal layer.

20. The method of claim 19, further comprising:
forming a copper passivating layer on the metal layer; and
forming another metal layer using the copper passivating layer as a seed layer.

* * * * *